United States Patent
Shimizu

(10) Patent No.: US 8,730,757 B2
(45) Date of Patent: May 20, 2014

(54) MEMORY SYSTEM

(75) Inventor: Yuui Shimizu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/602,626

(22) Filed: Sep. 4, 2012

(65) Prior Publication Data

US 2013/0250693 A1 Sep. 26, 2013

(30) Foreign Application Priority Data

Mar. 26, 2012 (JP) ................. 2012-070160

(51) Int. Cl.
*G11C 8/00* (2006.01)

(52) U.S. Cl.
USPC .............. 365/233.1; 365/233.12; 365/233.13; 365/233.14; 327/161

(58) Field of Classification Search
USPC ............... 365/233.1, 233.12, 233.13, 233.14; 327/161
See application file for complete search history.

(56) References Cited

U.S. PATENT DOCUMENTS

| | | | |
|---|---|---|---|
| 6,788,588 B2* | 9/2004 | Nagai et al. ............... | 365/189.05 |
| 6,809,983 B2* | 10/2004 | Jung ........................ | 365/230.05 |
| 6,812,565 B2 | 11/2004 | Nishimoto et al. | |
| 7,135,906 B2* | 11/2006 | Takai et al. ................... | 327/263 |
| 7,236,424 B2* | 6/2007 | Tokiwa .................... | 365/233.12 |
| 7,612,598 B2* | 11/2009 | Endo .............................. | 327/291 |
| 7,733,141 B2* | 6/2010 | Oh ................................ | 327/158 |
| 7,932,759 B2* | 4/2011 | Abe et al. ...................... | 327/158 |
| 8,145,925 B2 | 3/2012 | Oh ................................ | 713/320 |
| 8,286,021 B2* | 10/2012 | Kim et al. ..................... | 713/400 |
| 8,508,272 B2* | 8/2013 | Chung .......................... | 327/161 |
| 2009/0187701 A1 | 7/2009 | Kim | |
| 2012/0147692 A1* | 6/2012 | Nakamura et al. ......... | 365/233.1 |

FOREIGN PATENT DOCUMENTS

| | | |
|---|---|---|
| JP | 2002-190196 | 7/2002 |
| JP | 2003-204030 | 7/2003 |
| JP | 2011-510426 | 3/2011 |

\* cited by examiner

*Primary Examiner* — Viet Q Nguyen

(74) *Attorney, Agent, or Firm* — Oblon, Spivak, McClelland, Maier & Neustadt, L.L.P.

(57) ABSTRACT

According to one embodiment, a memory system includes a first semiconductor memory and a controller. The first semiconductor memory receives a first clock, and outputs, in accordance with the first clock, a second clock and a data signal in synchronization with the second clock. The controller includes a detection circuit which detects a shift of a duty ratio of the second clock which is output from the first semiconductor memory. The controller also includes an adjustment circuit which adjusts a duty ratio of the first clock based on the shift detected by the detection circuit.

17 Claims, 10 Drawing Sheets

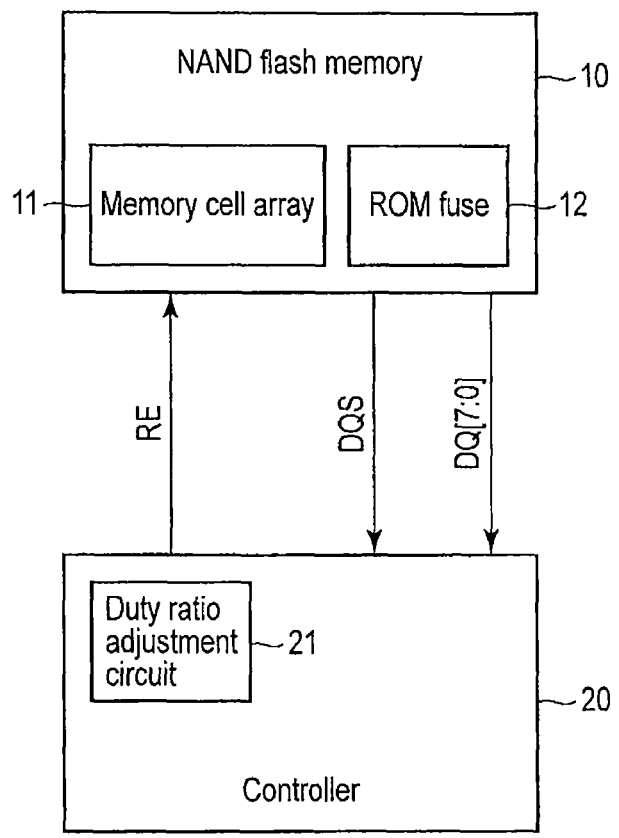
F I G. 1
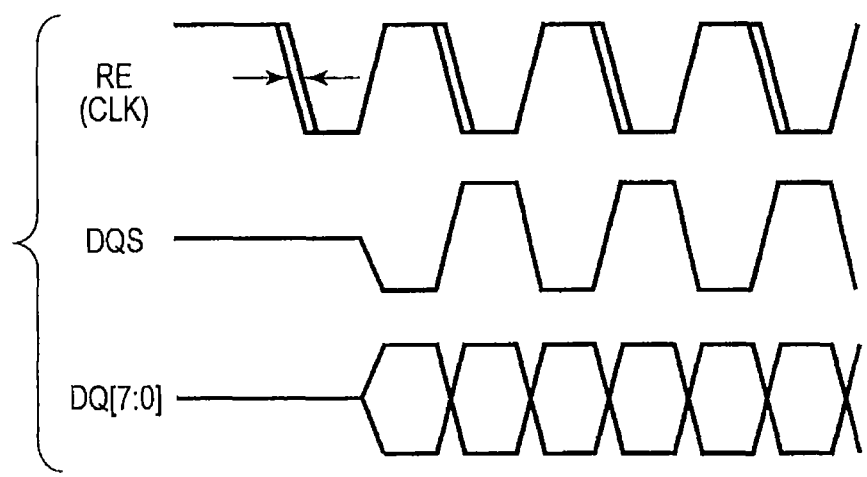
F I G. 2

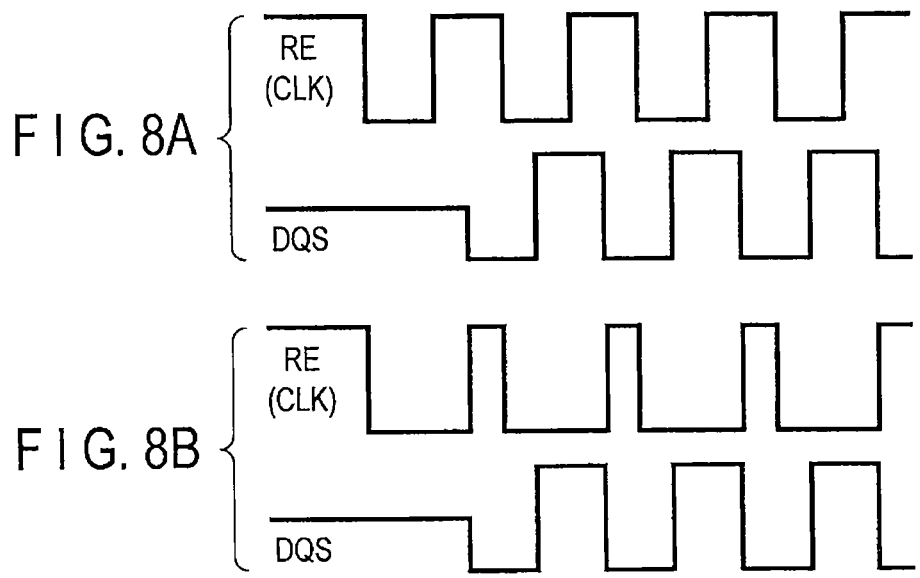
F I G. 8A
F I G. 8B
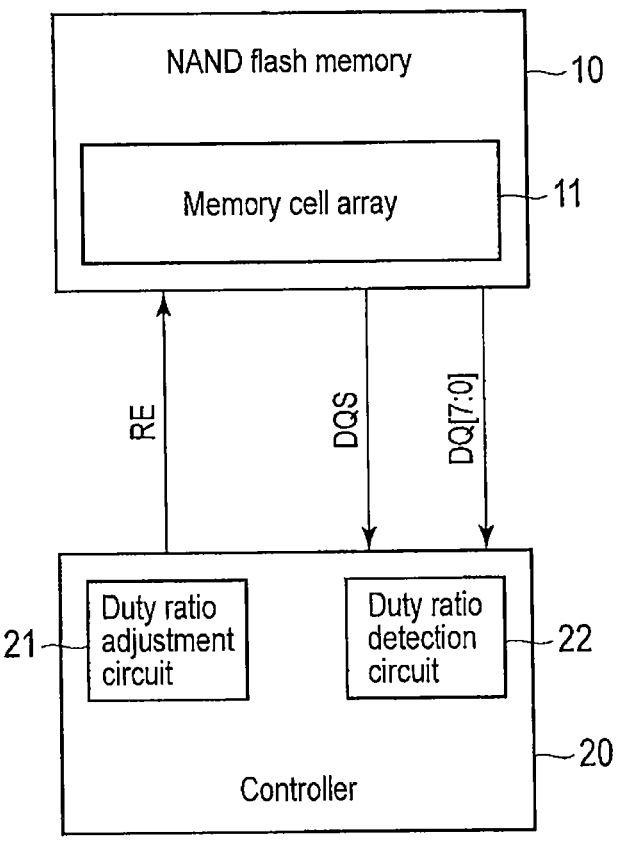
F I G. 9

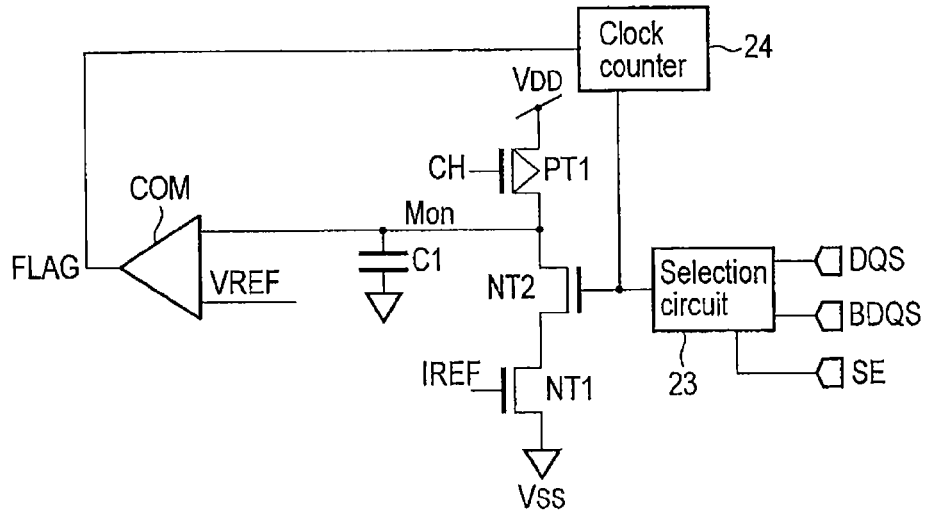
F I G. 10
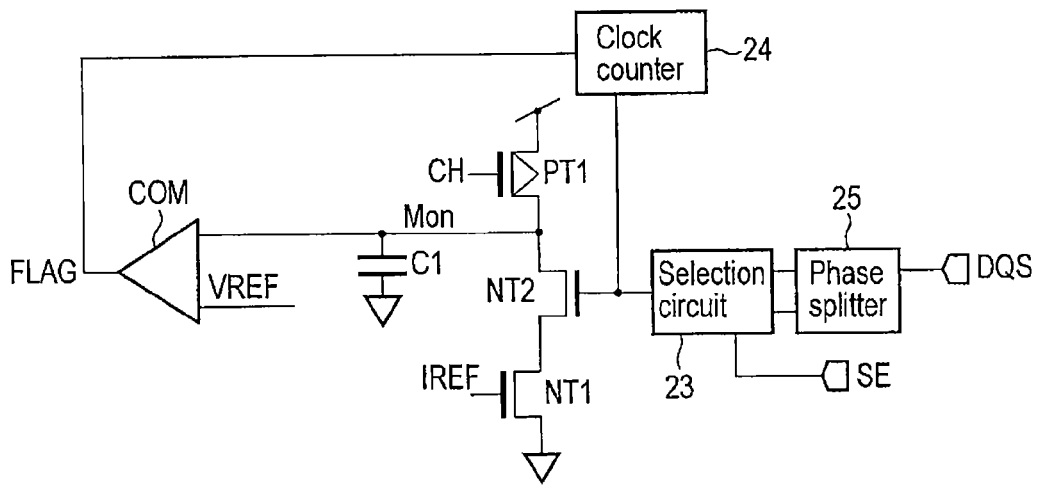
F I G. 11

MEMORY SYSTEM

CROSS-REFERENCE TO RELATED APPLICATIONS

This application is based upon and claims the benefit of priority from Japanese Patent Application No. 2012-070160, filed Mar. 26, 2012, the entire contents of which are incorporated herein by reference.

1. FIELD

Embodiments described herein relate generally to a memory system including a semiconductor memory and a controller for controlling the semiconductor memory.

2. BACKGROUND

In recent years, in semiconductor memories such as a NAND flash memory, an interface for exchange data with a controller and the like achieves a high speed data transfer. Most of such semiconductor memories use a method for reading data using both the rising and falling edges of a clock such as a read enable signal.

In this method, when the clock propagates through the semiconductor memory, a high level period and a low level period are desirably the same, but during propagation, the duty ratio of the clock is shifted. This is because there are more than a few elements that deteriorate the duty ratio in a receiver circuit for receiving a clock on a semiconductor memory, a repeater circuit, a circuit for latching data, and a circuit such as a level shifter if necessary.

When the duty ratio of the clock is significantly shifted, this may result in the following situations such as: desired data reading process may be disturbed at a high speed operation and a controller side may fail to correctly receive data.

BRIEF DESCRIPTION OF THE DRAWINGS

FIG. 1 is a block diagram illustrating a configuration of a memory system according to a first embodiment;

FIG. 2 is a figure illustrating signals which are output from a NAND flash memory and a controller during reading operation;

FIGS. 8A and 8B are timing charts illustrating the relationship between a read enable signal and a strobe in the memory system according to the first embodiment;

FIG. 9 is a block diagram illustrating a configuration of a memory system according to a second embodiment;

FIG. 10 is a circuit diagram illustrating a duty ratio detection circuit in a controller according to the second embodiment;

FIG. 11 is another circuit diagram illustrating a duty ratio detection circuit in the controller according to the second embodiment;

DETAILED DESCRIPTION

Figure 3:
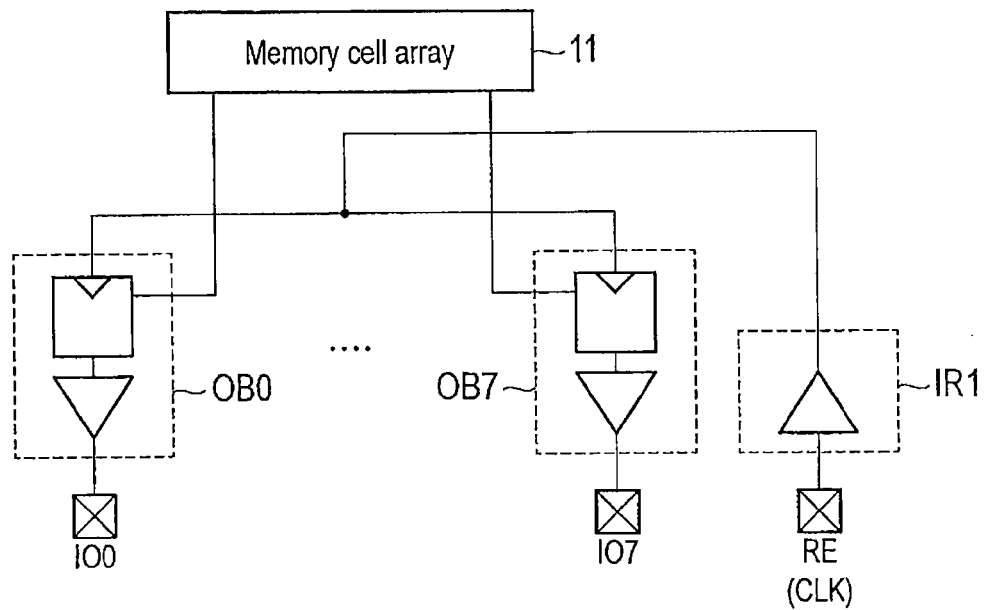
FIG. 3 is a circuit diagram illustrating a data output circuit of the NAND flash memory according to the first embodiment.

Hereinafter, a memory system according to embodiments will be explained with reference to drawings. The memory system includes a semiconductor memory and a controller. In this case, for example, a NAND flash memory will be explained as a semiconductor memory. In the explanation below, constituent elements having the same functions and configurations are denoted with the same reference numbers, and explanation will be repeatedly made only when necessary.

In general, according to one embodiment, a memory system includes a first semiconductor memory and a controller. The first semiconductor memory receives a first clock, and outputs, in accordance with the first clock, a second clock and a data signal in synchronization with the second clock. The controller includes a detection circuit which detects a shift of a duty ratio of the second clock which is output from the first semiconductor memory. The controller also includes an adjustment circuit which adjusts a duty ratio of the first clock based on the shift detected by the detection circuit.

[First Embodiment]

FIG. 1 is a block diagram illustrating a configuration of a memory system according to the first embodiment.

As illustrated in the drawing, the memory system includes a semiconductor memory such as a NAND flash memory 10 and a controller 20. The NAND flash memory 10 includes a memory cell array 11 in which a plurality of memory cells storing data is arranged in a matrix manner, and also includes a storage unit for storing information such as a ROM fuse (or a register) 12.

The controller 20 transmits various kinds of signals including a clock to the NAND flash memory 10, and controls operation of the NAND flash memory 10. Further, the controller 20 includes a duty ratio adjustment circuit 21. The duty ratio adjustment circuit 21 adjusts the duty ratio of the clock transmitted to the NAND flash memory 10 such as a read enable signal RE.

Subsequently, reading operation of the memory system according to the first embodiment will be explained.

FIG. 2 is a figure illustrating signals which are output from the NAND flash memory 10 and the controller 20 during reading operation.

As illustrated in the drawing, first, a clock such as a read enable signal RE is transmitted from the controller 20 to the NAND flash memory 10. The NAND flash memory 10 transmits a strobe DQS and a data signal DQ to the controller 20. In strobe DQS and data signal DQ, data are always inverted at the rising and falling edges of read enable signal RE. The reading operation is performed when the controller 20 retrieves data from data signal DQ in synchronization with strobe DQS.

The data output circuit provided in the NAND flash memory 10 will be explained with reference to FIGS. 3, 4, and 5.

Figure 4:
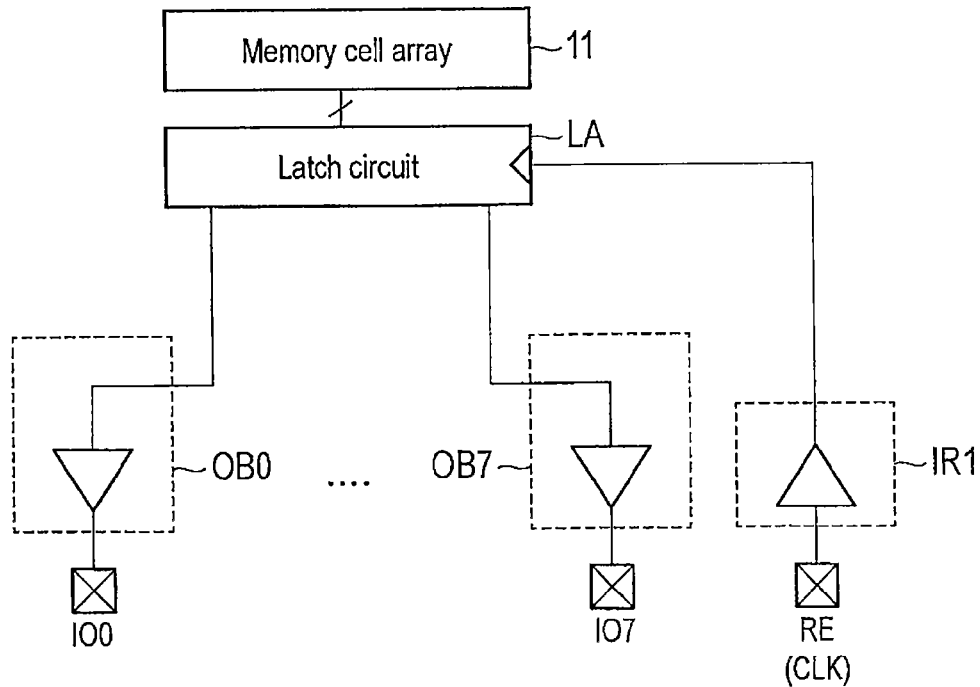
FIG. 4 is another circuit diagram illustrating a data output circuit of the NAND flash memory according to the first embodiment.

FIGS. 3 and 4 are circuit diagrams illustrating the data output circuit of the NAND flash memory 10.

FIG. 3 illustrates an example of a data output circuit. Read enable signal RE is received by an input receiver IR1, and is provided to output buffers OB0, . . . , OB7. In the output buffer, data which are output from the memory cell array 11 are latched. The output buffer outputs data, which were latched when read enable signal RE was input, to input/output terminals IO0, . . . , IO7.

FIG. 4 illustrates another example of data output circuit. Read enable signal RE is received by the input receiver IR1, and is provided to a latch circuit LA. In the latch circuit LA, data which are output from the memory cell array 11 are latched. The latch circuit LA outputs data, which were latched when read enable signal RE was input, to the input/output terminals IO0, . . . , IO7 via the output buffers OB0, . . . , OB7.

Figure 5:
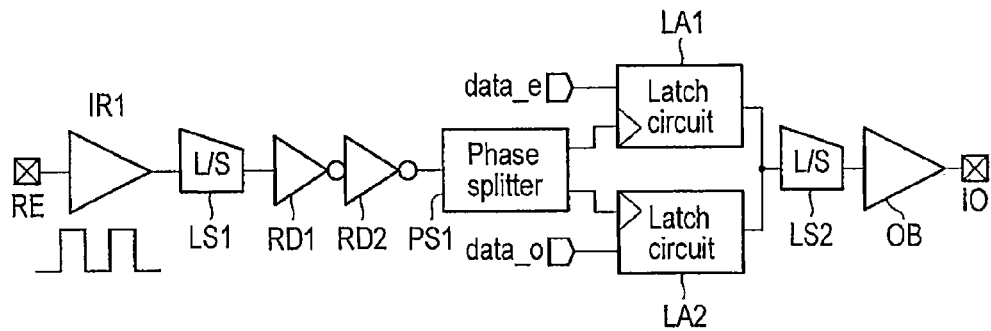
FIG. 5 is a detailed circuit diagram illustrating a data output circuit of the NAND flash memory according to the first embodiment.

FIG. 5 is an example of a detailed circuit illustrating a data output circuit of the NAND flash memory 10.

Read enable signal RE received by the input receiver IR1 is provided to a phase splitter PS1 via a level shifter LS1 and drivers RD1 and RD2. Read enable signal RE which is input into the phase splitter PS1 is divided into a positive-phase signal and an inverted signal thereof as it is, which are input to latch circuits LA1 and LA2. Latch circuits LA1 and LA2 output data, which were latched when read enable signal RE was input, to an input/output terminal IO via a level shifter LS2 and an output buffer OB.

In this case, read enable signal RE passes through the input receiver IR1, the level shifter LS1, and drivers RD1 and RD2, and as a result, in each circuit, the duty ratio changes from the duty ratio at the input. The change is different according to the through rate and the signal level of the input signal such as read enable signal RE, and has a unique value for each NAND flash memory 10.

Subsequently, the duty ratio adjustment circuit 21 provided in the controller 20 for adjusting the duty ratio of read enable signal RE will be explained.

Figure 6A:
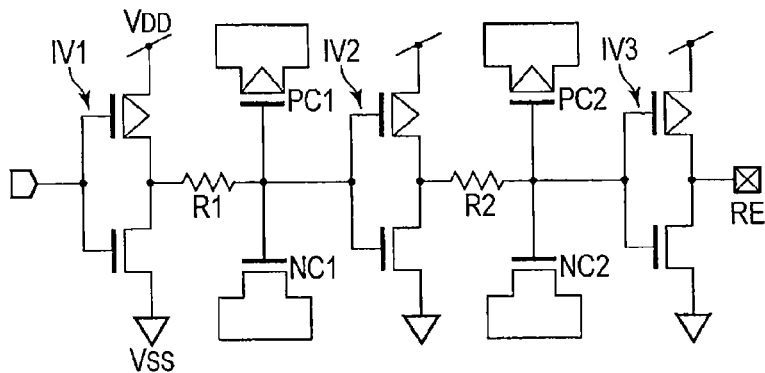
FIGS. 6A and 6B are circuit diagrams illustrating a duty ratio adjustment circuit in a controller according to the first embodiment.

FIG. 6A is an example of a circuit diagram illustrating a duty ratio adjustment circuit of the controller 20.

As illustrated in the drawing, the duty ratio adjustment circuit 21 includes inverters IV1, IV2 and IV3; nMOS capacitors NC1 and NC2; pMOS capacitors PC1 and PC2; and resistors R1 and R2. The nMOS capacitor NC1 and pMOS capacitor PC1 serve as capacitors for delaying a rising edge, and nMOS capacitor NC2 and pMOS capacitor PC2 serve as capacitors for delaying a falling edge. The duty ratio of read enable signal RE can be adjusted by choosing whether to cause nMOS capacitors NC1 and NC2 or pMOS capacitors PC1 and PC2 to serve as capacitors.

Figure 6B:
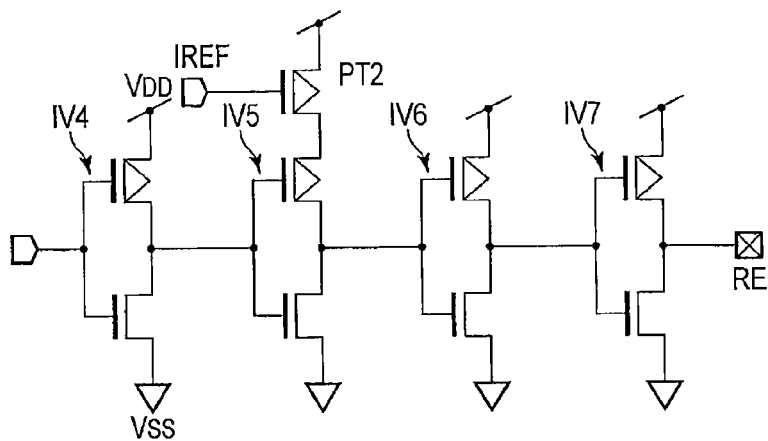

FIG. 6B is another example of a circuit diagram illustrating a duty ratio adjustment circuit of the controller 20.

The duty ratio adjustment circuit 21 as shown in FIG. 6B includes inverters IV4, IV5, IV6 and IV7, and a pMOS transistor PT2. Timing of rising edges of read enable signal RE can be changed by controlling a current IREF supplied to the gate of pMOS transistor PT2. Thereby, the duty ratio of read enable signal RE can be adjusted.

Subsequently, operation for adjusting the duty ratio of the clock in the memory system according to the first embodiment will be explained.

Figure 7:
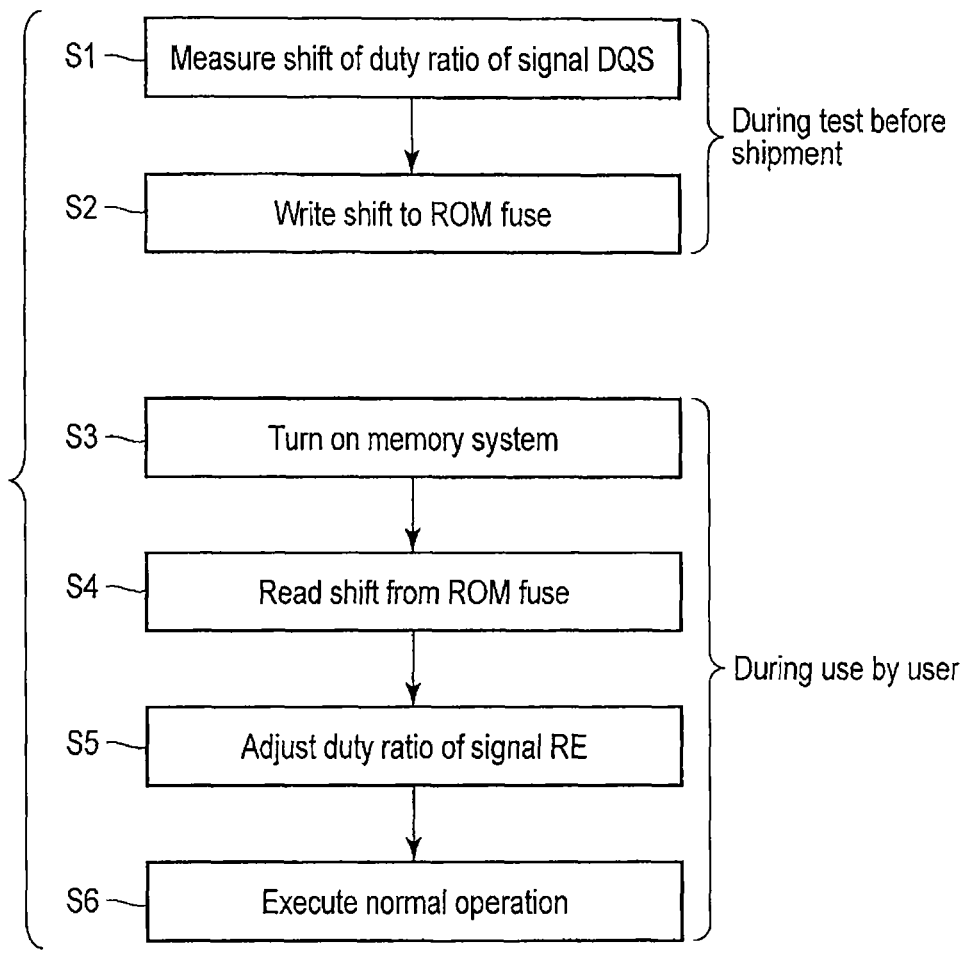
FIG. 7 is a flowchart illustrating operation in the memory system according to the first embodiment.

FIG. 7 is a flowchart illustrating operation in the memory system according to the first embodiment.

In a test before shipment, for example, a test circuit is used to measure the shift of the duty ratio of strobe DQS which is output from the NAND flash memory 10 (step S1). Subsequently, the shift thus measured is written to a ROM fuse 12 in the NAND flash memory 10 (step S2).

Thereafter, when the memory system is turned on during use by a user (step S3), the controller 20 reads the shift of the duty ratio from the ROM fuse 12 (step S4). Subsequently, based on the shift, the duty ratio adjustment circuit 21 adjusts the duty ratio of read enable signal RE, and outputs the adjusted read enable signal RE to the NAND flash memory 10 (step S5). Thereafter, the memory system executes normal operation (step S6).

FIGS. 8A, 8B are timing charts illustrating the relationship between read enable signal RE and strobe SQS in the memory system.

As illustrated in FIG. 8A, suppose that the NAND flash memory 10 can faithfully transmit strobe DQS and data signal DQ with the duty ratio of read enable signal RE. In this case, because of circuits and the like in the NAND flash memory 10 through which read enable signal RE passes, the duty ratio of read enable signal RE changes, and in accordance with the changed duty ratio, the duty ratio of strobe DQS and data signal DQ is also changed. More specifically, when read enable signal RE passes through various kinds of circuits in the NAND flash memory 10, the duty ratio of read enable signal RE changes in each circuit. The change is different according to the through rate and the signal level of read enable signal RE, and has a unique value for each NAND flash memory 10.

Therefore, the shift of the duty ratio of strobe DQS that is caused by the change of the duty ratio of read enable signal RE as described above is measured in advance, and the shift thus measured is recorded to the ROM fuse 12.

Then, when the memory system is activated, the shift is read from the ROM fuse 12, and based on the shift, the duty ratio of read enable signal RE is adjusted by the duty ratio adjustment circuit 21, and the adjusted read enable signal RE is output to the NAND flash memory 10. For example, when read enable signal RE of which duty ratio is adjusted is input as illustrated in FIG. 8B, strobe DQS of which duty ratio is not shifted is caused to output from the NAND flash memory 10. More specifically, the duty ratio adjustment circuit 21 adjusts the duty ratio of read enable signal RE so that a duty ratio between a high level period and a low level period of strobe DQS becomes close to 50:50.

As described above, in the first embodiment, the duty ratio of a clock such as the read enable signal transmitted from the controller is adjusted so as to correct the shift of the duty ratio in the NAND flash memory, whereby the shift of the duty ratio of each of strobe DQS and data signal DQ which are output from the NAND flash memory can be reduced. More specifically, this can reduce deviation of data cycles which are output from the NAND flash memory 10.

In the first embodiment, the NAND flash memory is used as the semiconductor memory. However, the first embodiment is not limited thereto. The first embodiment can also be applied in the same manner even when other semiconductor memories are used. The semiconductor memory and the controller may be formed as individual chips, or the semiconductor memory and the controller may be formed on the same semiconductor chip.

[Second Embodiment]

In the first embodiment, the shift of the duty ratio of the strobe is measured and the shift thus measured is recorded to the ROM fuse during testing before shipment, and when the memory system is activated, the shift is read and the duty ratio is corrected. In this second embodiment, a controller includes a duty ratio detection circuit for detecting the shift of a duty ratio of a strobe. In accordance with the shift of the duty ratio obtained by the duty ratio detection circuit, the duty ratio of read enable signal RE is adjusted.

FIG. 9 is a block diagram illustrating a configuration of a memory system according to the second embodiment.

As illustrated in the drawing, in the second embodiment, the controller 20 has a duty ratio detection circuit 22. The duty ratio detection circuit 22 receives a strobe DQS from a NAND flash memory 10, and detects the shift of the duty ratio of strobe DQS. The other configuration is the same as that of the first embodiment.

FIG. 10 is a circuit diagram illustrating the duty ratio detection circuit 22 provided by the controller 20.

As illustrated in the drawing, the duty ratio detection circuit 22 includes a selection circuit 23, a clock counter 24, a comparator COM, nMOS transistors NT1 and NT2, a pMOS transistor PT1, and a capacitor C1.

The duty ratio detection circuit 22 provides strobes DQS and BDQS to the selection circuit 23. Strobe BDQS is strobe DQS inverted. In a selection signal SE, the selection circuit 23 selects any one of strobe DQS and strobe BDQS, and outputs the selected one to the gate of nMOS transistor NT2. Accordingly, discharge of the voltage of the node Mon accumulated in capacitor C1 is controlled by turning on or off nMOS transistor NT2. Further, the comparator COM compares the voltage of the node Mon and the reference voltage VREF, and flag signal FLAG obtained according to the comparison result is output to the clock counter 24. With this operation, the duty ratio of strobe DQS is detected.

FIG. 11 is a circuit diagram illustrating another example of a duty ratio detection circuit 22.

In the circuit as illustrated in FIG. 10, both of strobes DQS and BDQS are provided to the selection circuit 23, and the selection circuit 23 selects any one of strobes DQS and BDQS, and the selected signal is provided to the gate of nMOS transistor NT2.

In the duty ratio detection circuit as illustrated in FIG. 11, strobe DQS is provided to a phase splitter 25. Strobe DQS which is input into the phase splitter 25 is divided into a positive-phase signal DQS and an inverted signal BDQS thereof as it is, which are input into the selection circuit 23. Subsequent operation is the same as the circuit as illustrated in FIG. 10.

Figure 12:
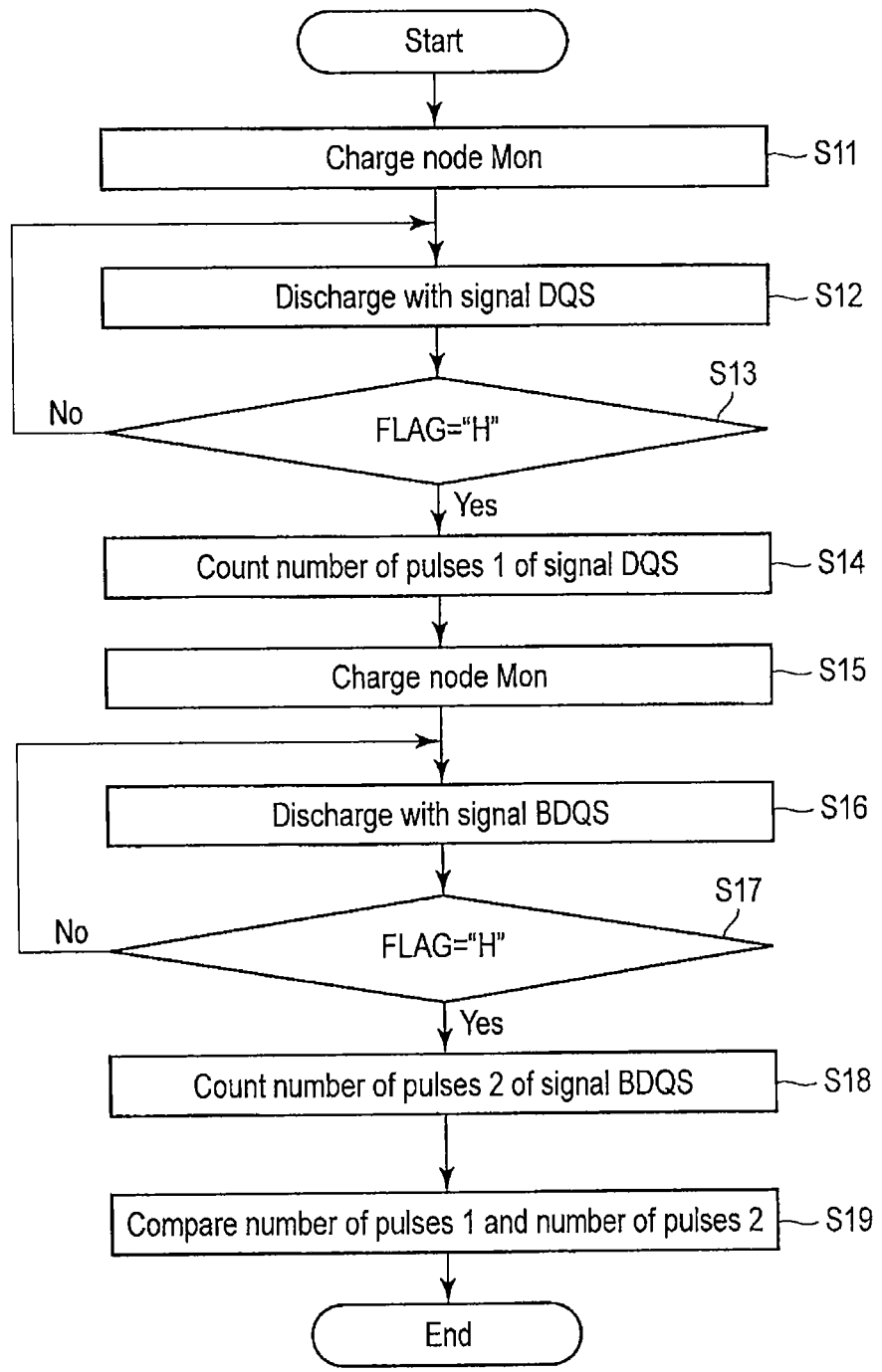
FIG. 12 is a flowchart illustrating detection operation of a duty ratio in the duty ratio detection circuit according to the second embodiment.

Hereinafter, operation for detecting the duty ratio of strobe DQS will be explained with reference to the flow as illustrated in FIG. 12.

FIG. 12 is a flowchart illustrating detection operation of the duty ratio in the duty ratio detection circuit 22 according to the second embodiment.

As illustrated in the drawing, first, the controller 20 turns on pMOS transistor PT1 with a signal CH, so that the node Mon is charged to a power supply voltage VDD (step S11). Subsequently, nMOS transistor NT2 is turned on and off with strobe DQS, so that the voltage of the node Mon is discharged (step S12).

The controller 20 repeatedly turns on and off nMOS transistor NT2 with strobe DQS until the voltage of the node Mon becomes less than the reference voltage VREF. When the voltage of the node Mon is less than the reference voltage VREF, the comparator COM makes flag signal FLAG high (step S13). Then, the clock counter 24 counts the number of pulses of strobe DQS until then (step S14). More specifically, the controller 20 discharges the voltage of the node Mon with strobe DQS until flag signal FLAG goes high, and when flag signal FLAG goes high, the discharging process with strobe DQS is terminated, and the number of pulses of strobe DQS at that moment is recorded.

Subsequently, likewise, the controller 20 obtains the number of pulses 2 of strobe BDQS until flag signal FLAG goes high (step S15 to S18). Finally, the controller 20 compares the number of pulses 1 and the number of pulses 2, and obtains the shift of the duty ratio of strobe DQS from this difference (step S19). More specifically, the shift of the duty ratio of strobe DQS is calculated based on how many pulses is the difference between the number of pulses of strobe DQS and the number of pulses of strobe BDQS.

Subsequently, operation for adjusting the duty ratio of the clock according to the memory system according to the second embodiment will be explained.

Figure 13:
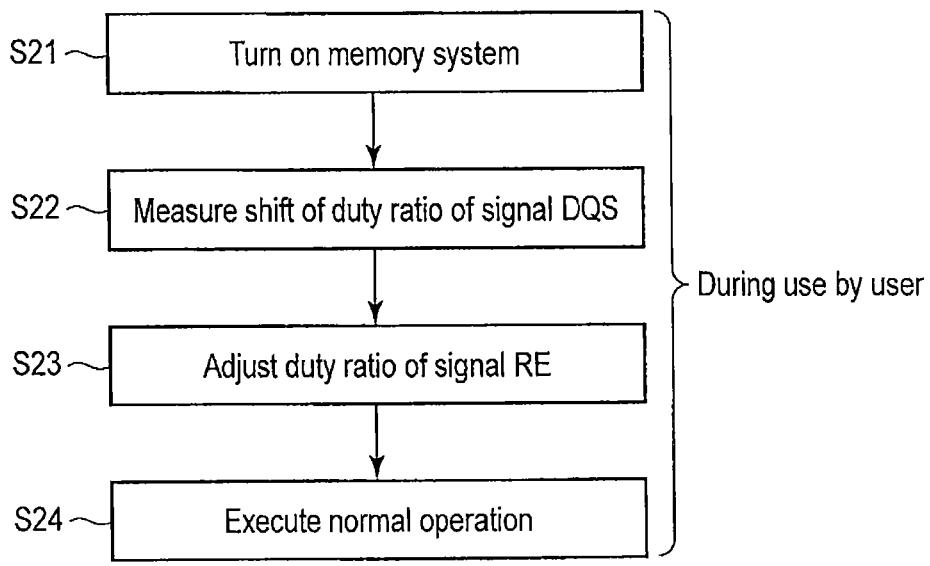
FIG. 13 is a flowchart illustrating operation in the memory system according to the second embodiment.

FIG. 13 is a flowchart illustrating operation according to the memory system according to the second embodiment.

When the memory system is turned on during use by a user (step S21), the controller 20 uses the duty ratio detection circuit 22 to measure the shift of the duty ratio of strobe DQS which is output from the NAND flash memory 10 (step S22).

Subsequently, based on the shift thus measured, the duty ratio adjustment circuit 21 adjusts the duty ratio of read enable signal RE (step S23). Thereafter, the memory system executes normal operation (step S24).

In the example explained above, the shift of the duty ratio of strobe DQS is measured, and the duty ratio of read enable signal RE is adjusted based on the shift thus obtained. Another method for adjusting the duty ratio of read enable signal RE is as follows. While the duty ratio of read enable signal RE is changed the numbers of pulses 1 and 2 are obtained, and the duty ratio of read enable signal RE may be determined so that the difference between the number of pulses 1 and the number of pulses 2 is within a predetermined value.

According to the second embodiment, in actual use environment after the NAND flash memory 10 and the controller 20 are implemented on the substrate, the duty ratio of read enable signal RE can be adjusted. Therefore, the shift of the duty ratio of each of strobe DQS and data signal DQ which are output from the NAND flash memory 10 can be reduced. More specifically, this can reduce deviation of data cycles which are output from the NAND flash memory 10.

The shift of the duty ratio of read enable signal RE which is input into the NAND flash memory 10 greatly changes because of the through rate. Therefore, after the NAND flash memory 10 and the controller 20 are implemented, the shift of strobe DQS is detected in an environment in which they are used, and the duty ratio of read enable signal RE is adjusted based on the shift. Accordingly, the shift of the duty ratio of each of strobe DQS and data signal DQ which are output from the NAND flash memory 10 can be accurately reduced.

In particular, in the input circuit provided with the input signal such as read enable signal RE in the NAND flash memory 10, the duty ratio of the propagation signal changes because of the through rate of the input signal. It is extremely difficult to make adjustment with the circuit in accordance with the through rates of the signal levels of multiple input signals. Therefore, it is advantageous to be able to correct the input signal after implementation. The other configuration and effects are the same as those of the first embodiment.

[Third Embodiment]

In the third embodiment, when the memory system is initially activated, the shift of a duty ratio of a strobe is measured, and the shift thus measured is recorded to a ROM fuse. Then, in accordance with the shift recorded in the ROM fuse, the duty ratio of read enable signal RE is adjusted. After that, the shift recorded in the ROM fuse is read and the duty ratio of read enable signal RE is adjusted when the memory system is activated.

Figure 14:
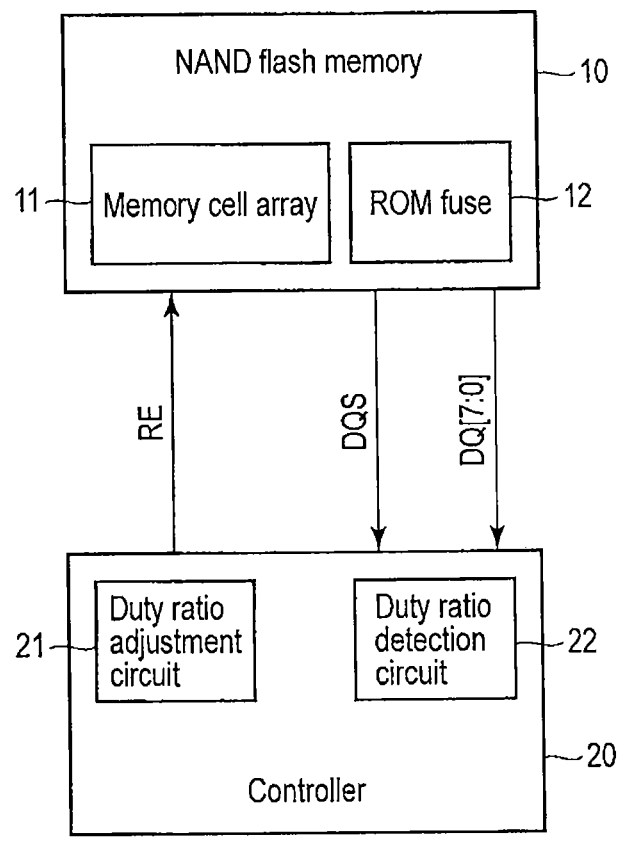
FIG. 14 is a block diagram illustrating a configuration of a memory system according to a third embodiment.

FIG. 14 is a block diagram illustrating a configuration of a memory system according to the third embodiment.

As illustrated in the drawing, in the third embodiment, a controller 20 includes a duty ratio detection circuit 22, and a NAND flash memory 10 includes a ROM fuse (or a register) 12. The duty ratio detection circuit 22 receives a strobe DQS from the NAND flash memory 10, and detects the shift of the duty ratio of strobe DQS. The ROM fuse 12 records the shift of the duty ratio of strobe DQS detected by the duty ratio detection circuit 22.

Subsequently, operation for adjusting the duty ratio of the clock in the memory system according to the third embodiment will be explained.

Figure 15:
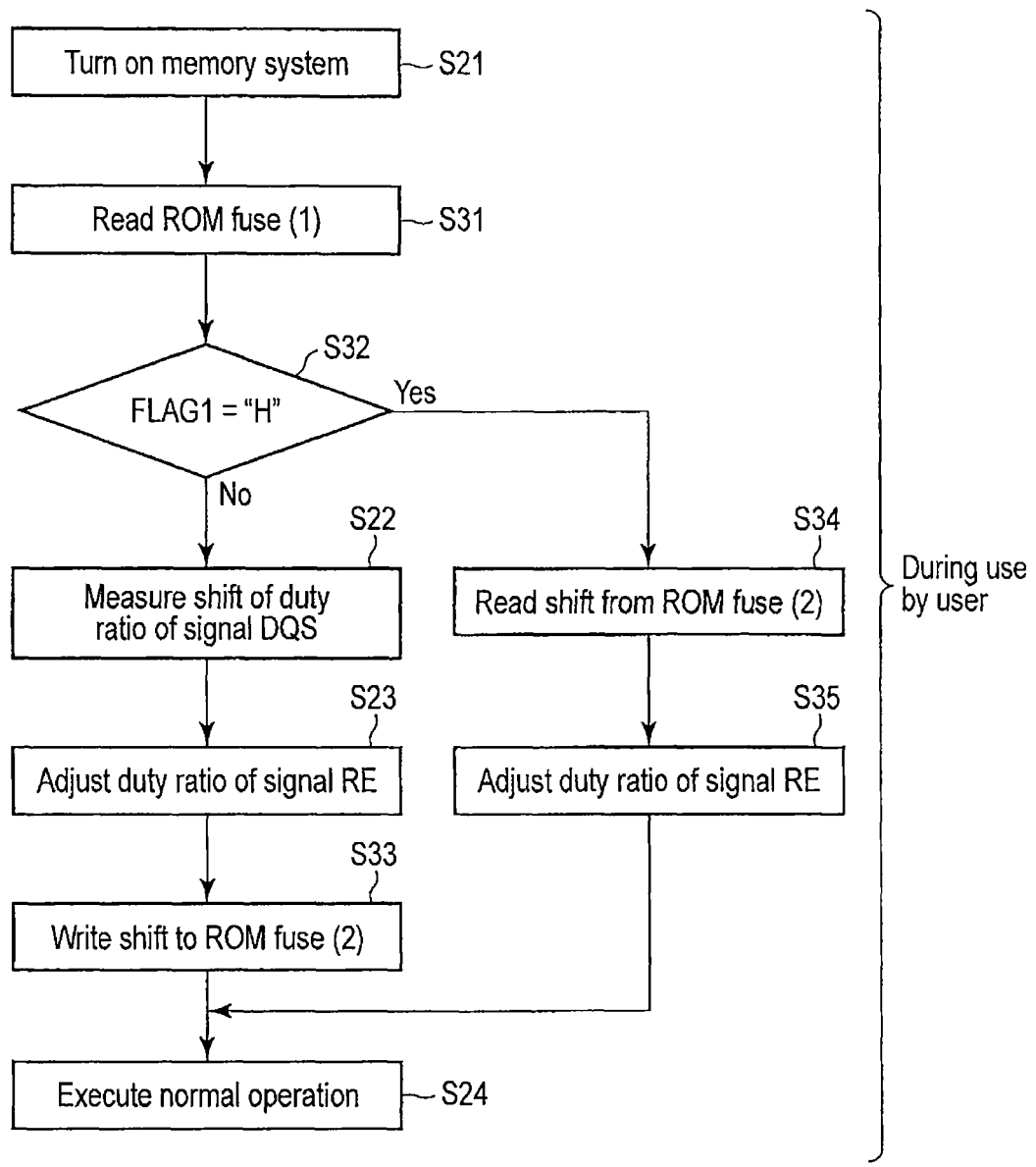
FIG. 15 is a flowchart illustrating operation in the memory system according to the third embodiment.

FIG. 15 is a flowchart illustrating operation in the memory system according to the third embodiment.

When the memory system is turned on during use by a user (step S21), the controller 20 reads a flag signal FLAG1 from the ROM fuse (1) in the NAND flash memory 10 (step S31). Flag signal FLAG1 indicates whether the shift of the duty ratio of strobe DQS is recorded in the ROM fuse (2) or not. When the shift of the duty ratio of strobe DQS is already recorded in the ROM fuse (2), flag signal FLAG1 is high, and when the shift of the duty ratio of strobe DQS is not recorded in the ROM fuse (2), flag signal FLAG1 is low.

Subsequently, the controller 20 determines whether flag signal FLAG1 is high (step S32). When flag signal FLAG1 is low, i.e., when the shift of strobe DQS is not yet recorded in the ROM fuse (2), the controller 20 measures the shift of the duty ratio of strobe DQS which is output from the NAND flash memory 10 by the duty ratio detection circuit 22 (step S22).

Subsequently, based on the shift thus measured, the controller 20 causes a duty ratio adjustment circuit 21 to adjust the duty ratio of read enable signal RE (step S23). Further, the shift thus measured is written to the ROM fuse (2) in the NAND flash memory 10 (step S33). Thereafter, the memory system executes normal operation (step S24).

On the other hand, when flag signal FLAG1 is determined to be high in step S32, i.e., when the shift of strobe DQS is already recorded in the ROM fuse (2), the controller 20 reads the shift from the ROM fuse (2) (step S34).

Subsequently, based on the shift thus read, the controller 20 causes the duty ratio adjustment circuit 21 to adjust the duty ratio of read enable signal RE (step S35). Thereafter, the memory system executes normal operation (step S24).

More specifically, when the memory system is used for the first time after the NAND flash memory 10 and the controller 20 are implemented, the shift of the duty ratio of strobe DQS is detected, and the shift thus detected is written to the ROM fuse 12 in the NAND flash memory 10. Thereafter, in subsequent uses, the shift recorded in the ROM fuse 12 is read, and the duty ratio of read enable signal RE is adjusted based on the shift.

With such operation, it is not necessary to detect the shift of the duty ratio of strobe DQS every time the memory system is turned on, so that a start-up time required to start the system can be reduced. In this case, for example, the shift of the duty ratio of the strobe is measured and recorded at the first time after the implementation. Alternatively, for example, when a certain level of temperature change is detected, the shift of the duty ratio of the strobe may be measured and recorded. In this case, flag signal FLAG1 indicating whether the shift is already recorded or not is recorded to a register and the like, so that it can be rewritten. The other configuration and effects are the same as those of the first embodiment.

[Fourth Embodiment]

In the fourth embodiment, an example will be explained in which a plurality of semiconductor memories, e.g., a plurality of NAND flash memories, and a controller for controlling them are provided.

Figure 16:
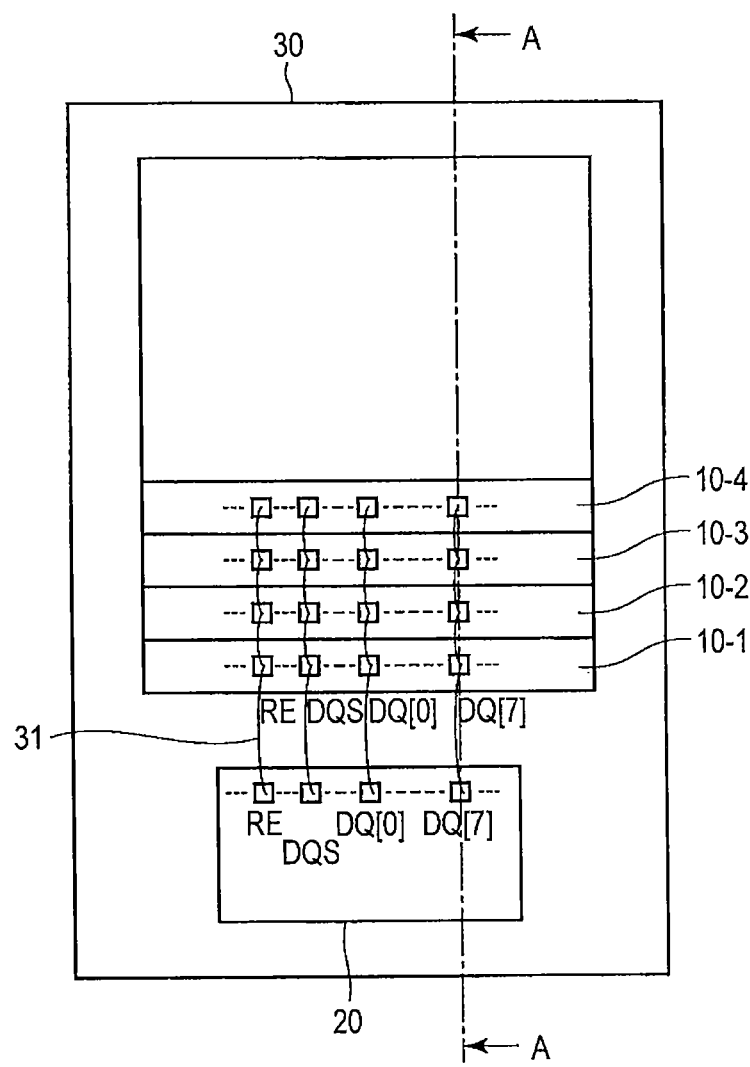
FIG. 16 is a top view illustrating a configuration of a memory system according to a fourth embodiment.
Figure 17:
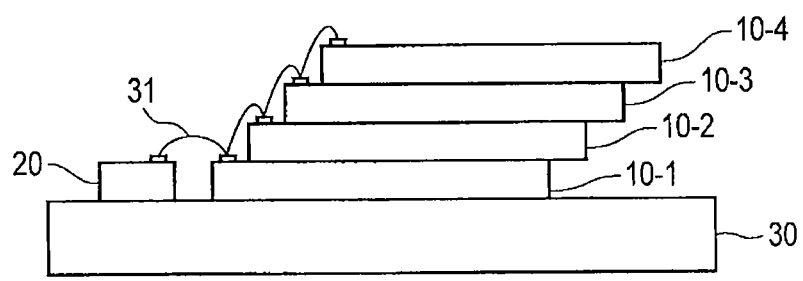
FIG. 17 is a cross sectional view illustrating the memory system according to the fourth embodiment.

FIG. 16 is a top view illustrating a configuration of a memory system according to a fourth embodiment. FIG. 17 is a cross sectional view taken along line A-A of FIG. 16, and shows the cross sectional structure of the memory system.

NAND flash memory chips (hereinafter referred to as memory chips) 10-1, 10-2, 10-3 and 10-4 are stacked on a substrate 30. Further, a controller chip 20 is placed on the substrate 30.

Terminals RE, terminals DQS, and terminals DQ[0] to DQ[7] are arranged on memory chips 10-1 to 10-4. Terminal RE is a terminal to which a read enable signal RE is input. Terminal DQS is a terminal from which a strobe DQS is output. Further, terminals DQ[0] to DQ[7] are terminals to which data signals DQ[0] to DQ[7] are respectively input or data signals DQ[0] to DQ[7] are respectively output.

Likewise, a terminal RE, a terminal DQS, and terminals DQ[0] to DQ[7] are also arranged on the controller chip 20. Terminal RE is a terminal from which read enable signal RE is output. Terminal DQS is a terminal to which strobe DQS is input. Further, terminals DQ[0] to DQ[7] are terminals to which data signals DQ[0] to DQ[7] are respectively input or data signals DQ[0] to DQ[7] are respectively output.

A wire 31 is bonded between terminal RE of the controller chip 20 and terminal RE of memory chip 10-1, so that these terminals RE are electrically connected to each other. The wire 31 is also bonded between terminals RE of memory chips 10-1 to 10-4, so that these terminals RE are electrically connected to each other.

Likewise, the wire 31 is bonded between terminal DQS of the controller chip 20 and terminal DQS of memory chip 10-1, so that these terminals DQS are electrically connected to each other. The wire 31 is also bonded between terminals DQS of memory chips 10-1 to 10-4, so that these terminals RE are electrically connected to each other.

Likewise, the wire 31 is respectively bonded between terminals DQ[0] to DQ[7] of the controller chip 20 and terminals DQ[0] to DQ[7] of memory chip 10-1, so that these terminals DQ[0] to DQ[7] are respectively, electrically connected to each other. The wire 31 is also respectively bonded between terminals DQ[0] to DQ[7] of memory chips 10-1 to 10-4, so that terminals DQ[0] to DQ[7] are electrically connected to each other.

In the memory system having the above structure, the plurality of memory chips 10-1 to 10-4 are connected to the controller chip 20. Therefore, the loads of terminals RE, terminals DQS, and terminals DQ[0] to DQ[7] increase, as compared with a case where only one memory chip is connected.

When the memory system operates, one memory chip is selected and driven with a chip enable signal. At this occasion, non-operating memory chips are also connected to terminal RE, terminal DQS, and terminal DQ[0] to DQ[7]. Therefore, from the perspective of the driving memory chip, parasitic capacitances of terminal RE, terminal DQS, and terminals DQ[0] to DQ[7] increase, which makes it difficult to allow the signal flowing in each terminal to flow therethrough.

Further, as illustrated in FIGS. 16 and 17, the length of wire from the controller chip 20 is different according to the positions of memory chips 10-1 to 10-4, and the inductance of the circuit including each terminal is different in each memory chip. Therefore, the factor for shifting the duty ratio of read enable signal RE is different in each memory chip.

Therefore, it is extremely effective to detect the shift of the strobe DQS for each memory chip and to be able to adjust the duty ratio of read enable signal RE based on the shift, after memory chips 10-1 to 10-4 and the controller chip 20 are implemented on the substrate. The other configuration is the same as that of the first embodiment.

As described above, according to the embodiments, the shift of the duty ratio of each of the data signal and the data strobe (clock) which are output from the semiconductor memory can be reduced. More specifically, this can reduce deviation of data cycles which are output from the semiconductor memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a first semiconductor memory which receives a first clock, and outputs, in accordance with the first clock, a second clock and a data signal in synchronization with the second clock; and
a controller comprising a detection circuit which detects a shift of a duty ratio of the second clock which is output from the first semiconductor memory, and also comprising an adjustment circuit which adjusts a duty ratio of the first clock based on the shift detected by the detection circuit,
wherein when the first semiconductor memory and the controller are turned on, the duty ratio of a first pulse of the first clock which is output from the controller is different from the duty ratio of a second pulse of the first clock which is output after the first pulse of the first clock.

2. The memory system according to claim 1,
wherein the first semiconductor memory comprises a storage unit which stores information about the shift of the duty ratio of the second clock, and
the adjustment circuit adjusts the duty ratio of the first clock, based on the information stored in the storage unit.

3. The memory system according to claim 2,
wherein the storage unit comprises any one of a ROM fuse and a register.

4. The memory system according to claim 1,
wherein the adjustment circuit adjusts the duty ratio of the first clock so that a ratio between a high level period and a low level period of the second clock becomes close to 50:50.

5. The memory system according to claim 1,
wherein the first semiconductor memory outputs the second clock and the data signal in accordance with rising and falling edges of the first clock.

6. The memory system according to claim 1,
wherein the first semiconductor memory includes a NAND flash memory.

7. A memory system comprising:
a first semiconductor memory which receives a first clock, and outputs, in accordance with the first clock, a second clock and a data signal in synchronization with the second clock;
a second semiconductor memory which receives a third clock, and outputs, in accordance with the third clock, a fourth clock and a data signal in synchronization with the fourth clock; and
a controller comprising a detection circuit which detects a shift of a duty ratio of each of the second and fourth clocks which are output from the first and second semiconductor memories, and also comprising an adjustment circuit which adjusts duty ratios of the first and third clocks based on the amounts of shift detected by the detection circuit,
wherein when the first and second semiconductor memories and the controller are turned on, the duty ratios of first pulses of the first and third clocks which are output from the controller are different from the duty ratios of second pulses of the first and third clocks which are output after the first pulses of the first and third clocks.

8. The memory system according to claim 7,
wherein the first semiconductor memory comprises a first storage unit which stores information about the shift of the duty ratio of the second clock,
the second semiconductor memory comprises a second storage unit which stores information about the shift of the duty ratio of the fourth clock
the adjustment circuit adjusts the duty ratios of the first and third clocks, based on the information stored in the first and second storage units.

9. The memory system according to claim 8,
wherein the first and second storage units comprise any one of a ROM fuse and a register.

10. The memory system according to claim 7,
wherein the duty ratio of the first clock which is output from the controller to the first semiconductor memory is different from the duty ratio of the third clock which is output from the controller to the second semiconductor memory.

11. The memory system according to claim 7,
wherein the adjustment circuit adjusts the duty ratio of the first clock so that a ratio between a high level period and a low level period of the second clock becomes close to 50:50.

12. The memory system according to claim 11,
wherein the adjustment circuit adjusts the duty ratio of the third clock so that a ratio between a high level period and a low level period of the fourth clock becomes close to 50:50.

13. The memory system according to claim 7,
wherein the first and second semiconductor memories include NAND flash memories.

14. A memory system comprising:
a semiconductor memory comprising a storage unit storing information; and
a controller which controls operation of the semiconductor memory, and reads data from the semiconductor memory,
wherein when the semiconductor memory and the controller are turned on, the controller reads the information stored in the storage unit in the semiconductor memory,
wherein the semiconductor memory receives a first clock, and outputs, in accordance with the first clock, a second clock and a data signal in synchronization with the second clock,
the information stored in the storage unit indicates the shift of the duty ratio of the second clock,
the controller comprises an adjustment circuit which adjusts a duty ratio of the first clock based on the shift, and when the semiconductor memory and the controller are turned on, the duty ratio of a first pulse of the first clock which is output from the controller is different from the duty ratio of a second pulse of the first clock which is output after the first pulse of the first clock.

15. The memory system according to claim 14,
wherein the adjustment circuit adjusts the duty ratio of the first clock so that a ratio between a high level period and a low level period of the second clock becomes close to 50:50.

16. The memory system according to claim 14,
wherein the semiconductor memory outputs the second clock and the data signal in accordance with rising and falling edges of the first clock.

17. The memory system according to claim 1,
wherein immediately after the first semiconductor memory and the controller are turned on, the first clock which is output from the controller comprises a duty ratio different in terms of time series.

* * * * *